United States Patent [19]
Nordwall

[11] Patent Number: 6,014,059
[45] Date of Patent: Jan. 11, 2000

[54] POWER AMPLIFIER AND METHOD THEREIN

[75] Inventor: Thomas Jan Peter Nordwall, Malmö, Sweden

[73] Assignee: Telefonaktiebolaget LM Ericsson, Stockholm, Sweden

[21] Appl. No.: 09/063,273

[22] Filed: Apr. 21, 1998

[30]  Foreign Application Priority Data

Apr. 21, 1997 [SE] Sweden ................................. 9701521

[51] Int. Cl.⁷ ....................................................... H03F 3/04
[52] U.S. Cl. ........................................... 330/289; 330/298
[58] Field of Search ................................... 330/289, 298, 330/207 P, 256, 266, 272

[56]     References Cited

U.S. PATENT DOCUMENTS

| | | | |
|---|---|---|---|
| 3,480,835 | 11/1969 | Richman | 317/41 |
| 3,864,642 | 2/1975 | Long et al. | 330/207 P |
| 4,042,889 | 8/1977 | Baker | 330/207 P |
| 4,321,554 | 3/1982 | Quilter | 330/298 |
| 4,355,287 | 10/1982 | Hoover | 330/264 |

FOREIGN PATENT DOCUMENTS

| | | |
|---|---|---|
| 0 663 720 A2 | 7/1995 | European Pat. Off. . |
| 2 661 053 | 10/1991 | France . |
| 26 37 270 | 9/1977 | Germany . |
| WO 94/16493 | 7/1994 | WIPO . |
| WO 95/31035 | 11/1995 | WIPO . |

*Primary Examiner*—Robert Pascal
*Assistant Examiner*—Henry Choe
*Attorney, Agent, or Firm*—Burns, Doane, Swecker & Mathis, L.L.P.

[57]     ABSTRACT

A power amplifier circuit is provided which comprises an input terminal for receiving an input signal and an output terminal for providing an output signal, and at least one transistor for amplifying the input signal to provide the output signal, and a module for controlling the input signal received at the input terminal, and a module for generating a control signal which substantially follows the temperature of the at least one transistor at least in a selected temperature range. The module for controlling the input signal controls the input signal such that the control signal is prevented from exceeding a pre-determined level. The level corresponds to a pre-determined temperature of the at least one transistor which is equal to or below a specified maximum temperature for the at least one transistor.

20 Claims, 7 Drawing Sheets

POWER AMPLIFIER AND METHOD THEREIN

This application claims priority under 35 U.S.C. §§119 and/or 365 to SE 9701521-8 filed in Sweden on Apr. 21, 1997; the entire content of which is hereby incorporated by reference.

TECHNICAL FIELD OF THE INVENTION

The invention relates to a power amplifier circuit having means for controlling an input signal for restricting a component temperature in the circuit. The invention further relates to a method of controlling the temperature.

DESCRIPTION OF RELATED ART

The output stage of a class AB or B power amplifier is normally designed to withstand the maximal power dissipation that will occur for the worst case of output amplitude/ output power. For a sine-wave, the worst case power dissipation will be at an output amplitude of $(\pi/2)V_{cc}$, where $V_{cc}$ is the power supply voltage. FIG. 1 illustrates a class B amplifier 10 connected to a loudspeaker 13. The collector of an npn-transistor 11 is connected to the $+V_{cc}$ terminal of a power supply, the emitter of the npn-transistor is connected to the emitter of a pnp-transistor 12 and the collector of the pnp-transistor is connected to the $-V_{cc}$ terminal of the power supply. The bases of the two transistors are connected together to form an input terminal. The emitters of the two transistors are connected to an output terminal. The maximum output amplitude is limited by the power supply voltages $+V_{cc}$ and $-V_{cc}$. If the input drive is raised higher the output will be distorted by clipping. The output power is determined by the output swing and the impedance of the loudspeaker. An amplifier that has to handle all kinds of audio signals, such as music, must be able to be driven continuously at the worst case power loss. In most cases it is the power loss that determines the size and cost of the transistors. The voltage and current capabilities are usually more than sufficient.

A known method used in some hi-fi amplifiers to avoid the problems of high power components and big heat-sinks, is to raise the power supply voltage for short peaks at the output. This means that for a short period of time the output power and power loss is increased. This period of time, however, must be kept sufficiently short to avoid overheating of the output transistors.

An audio amplifier having an attenuator positioned in front of a power amplifier is disclosed in the International Patent Application No. WO94/16493. The attenuator is controlled by an RMS detector and a threshold detector. Input signals to the power amplifier, which after amplification would exceed the RMS power capability, are attenuated by the attenuator.

Whilst the known power amplifier circuits described above functions quite adequately, they do have a number of disadvantages.

A first drawback is that the prior art amplifier circuits handle the problem of peak signals by changing the electrical potential of the power supply to the circuits. This design requires a complex circuitry and the supply of at least two electrical potentials from the power supply. Hence, this design is expensive to implement and requires a non-negligible space on a printed circuit board.

A second drawback, which is relevant to the power amplifier as disclosed in the International Patent Application No. WO94/16493, is that the attenuator is controlled by a signal which depends on a measured RMS input level. This design does not make maximum use of the potential power capability of the power amplifier since this is not determined by the RMS input level but by the maximum permissible temperature of the power transistor. This problem gives as a result that this amplifier needs to be over-dimensioned to handle a certain output power. This results in a bulky and expensive amplifier.

SUMMARY

It is an object of the present invention to provide a power amplifier circuit which overcomes or alleviates the above mentioned problems. It is a further object of the present invention to provide a method of controlling the temperature of a transistor in a power amplifier circuit.

A problem to be solved by the present invention is the use in the prior art power amplifier circuits of a complex circuitry and a supply of at least two electrical potentials from a power supply which is expensive to implement and which occupies a non-negligible space on a printed circuit board.

A further problem to be solved by the present invention is that the power capacity of the power transistors of the prior art power amplifiers is not utilised efficiently. This problem gives as a result in the prior art power amplifiers that these amplifiers need to be over-dimensioned to handle a certain output power. This results in bulky and expensive amplifiers.

The solution to the problems is to provide a power amplifier circuit according to the present invention which comprises an input terminal for receiving an input signal and an output terminal for providing an output signal, and at least one transistor for amplifying the input signal to provide the output signal, and means for controlling the input signal received at the input terminal, and means for generating a control signal which substantially follows the temperature of the at least one transistor at least in a selected temperature range. The means for controlling the input signal controls the input signal such that the control signal is prevented from exceeding a pre-determined level, the level corresponding to a pre-determined temperature of the at least one transistor which is equal to or below a specified maximum temperature for the at least one transistor.

According to another aspect of the present invention, a method of controlling the temperature of a transistor in a power amplifier circuit having an input terminal for receiving an input signal and an output terminal for providing an output signal is provided. The method comprises the steps of measuring the supplied power to the transistor, generating a control signal which substantially follows the temperature of the transistor, in at least a selected temperature range, by using the measured supplied power to the transistor, and controlling the input signal for preventing the control signal from exceeding a pre-determined level, the level corresponding to a temperature of the transistor which is equal to or below a specified maximum temperature for the transistor.

Thus full swing of an input signal with short peaks is allowed and the input signal is restricted only when its average level is too high.

The purpose of the present invention is to provide a power amplifier circuit which utilises the power capacity of the power transistors efficiently. A further purpose of the present invention is to provide a power amplifier circuit which is not expensive to implement and which can be implemented with small physical dimensions. A further purpose of the present invention is to provide a power amplifier circuit which can be supplied by a power supply having one fixed output potential. A further purpose of the present invention is to provide a method of controlling the temperature of a transistor in a power amplifier such that the output power capability of the output transistor can be utilised efficiently.

An advantage of the power amplifier circuit of the present invention is that the output power capability of the output transistor of a power amplifier circuit is utilised efficiently. A further advantage of the power amplifier circuit of the present invention is that it is not expensive to implement and that it can be implemented with small physical dimensions. A further advantage of the power supply. A further advantage of the method of controlling the temperature of a transistor in a power amplifier is that the output power capability of the output transistor is utilised efficiently.

DETAILED DESCRIPTION OF EMBODIMENTS

In an amplifier for a loudspeaker which is intended for speech only, such as the amplifiers found in mobile communication devices, e.g. portable phones, cellular phones and hands-free equipment to such phones, it is possible to make use of the fact that a speech signal may inherit as much as a 20 dB difference between the peak levels and the average level of the signal. As a matter of fact, a speech signal normally contains short bursts of peaks.

Equations 1 to 3, which are valid for a sine-wave and a class B or AB power amplifier, explain the impact of a speech signal in terms of power dissipation.

$$P_{out} = x^2 \frac{(V_{cc})^2}{2R1} \quad \text{Eq. 1}$$

$$P_s = x \frac{2(V_{cc})^2}{\pi R1} \quad \text{Eq. 2}$$

$$P_d = \frac{(V_{cc})^2}{R1} \left[ \frac{2}{\pi} x - \frac{x^2}{2} \right] \quad \text{Eq. 3}$$

Where $P_{out}$ is the output power, x is the output swing (0<x<1), R1 is the load on the output, $P_s$ is the power delivered by the power supply and $P_d$ is the power dissipation in the output transistors.

It can be concluded from Equation 3 that the maximum power dissipation in the output transistors, $P_d$, occurs for an output swing, x, of $2/\pi$. If the peak-to-average ratio of the speech signal is assumed to be 20 dB and the peaks are assumed not to drive the output into clipping, the average output swing, x, will be at 0.1. Comparing the power dissipation at the output swing equal 0.1, with the power dissipation at the output swing equal $2/\pi$ gives as result: $P_d(0.1)/P_d(2/\pi)=0.29$. The result is that it is possible to design the output transistors and the corresponding heat-sinks to handle only about 30% of the worst case power dissipation if the signal to be amplified is assumed to be a speech signal. Of course, this calls for a transistor protection circuit to be included which allows short output peaks, but limits the average power.

Figure 1:
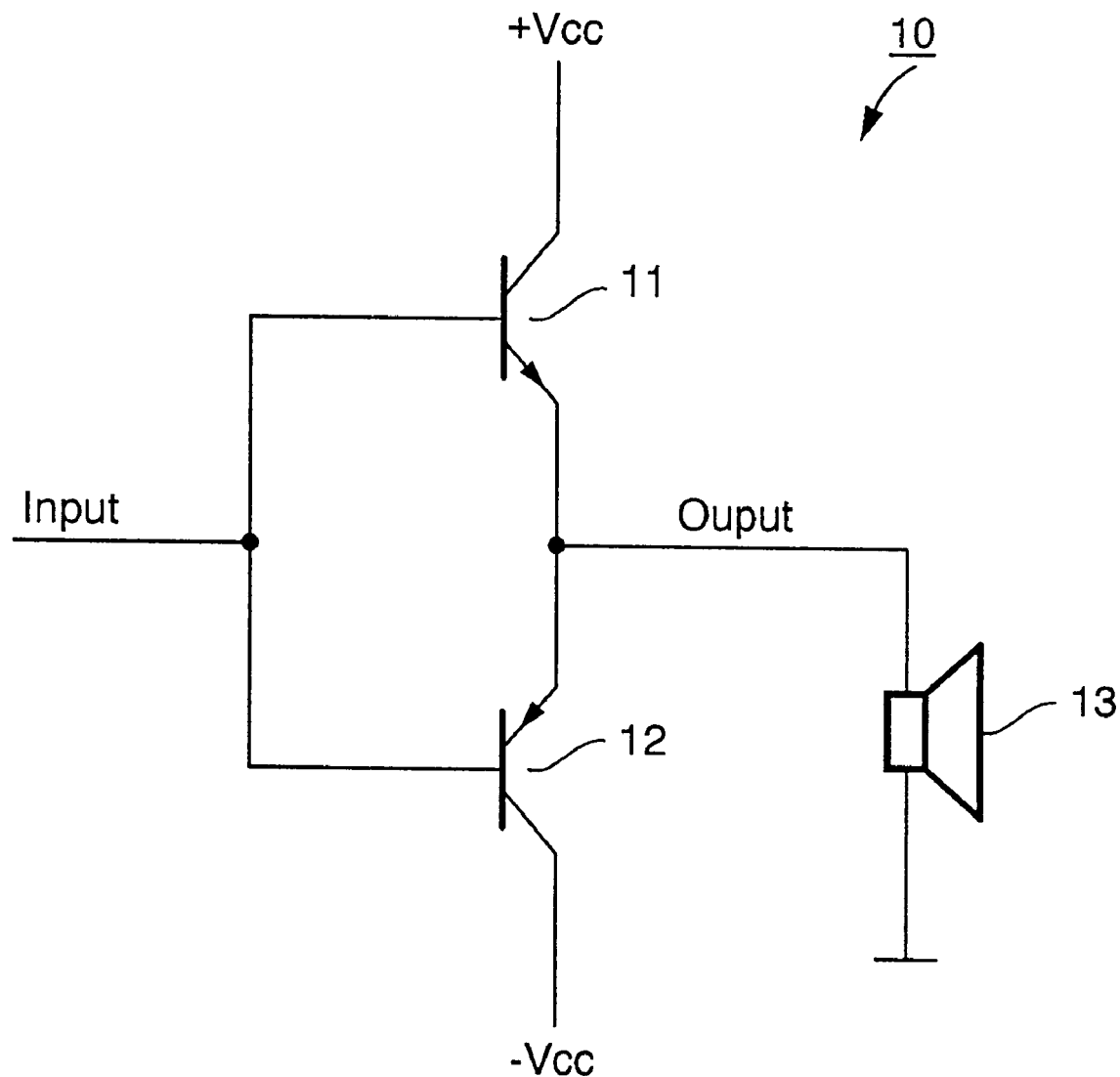
FIG. 1 illustrates a circuitry of a prior art class B amplifier connected to a loudspeaker.
Figure 2:
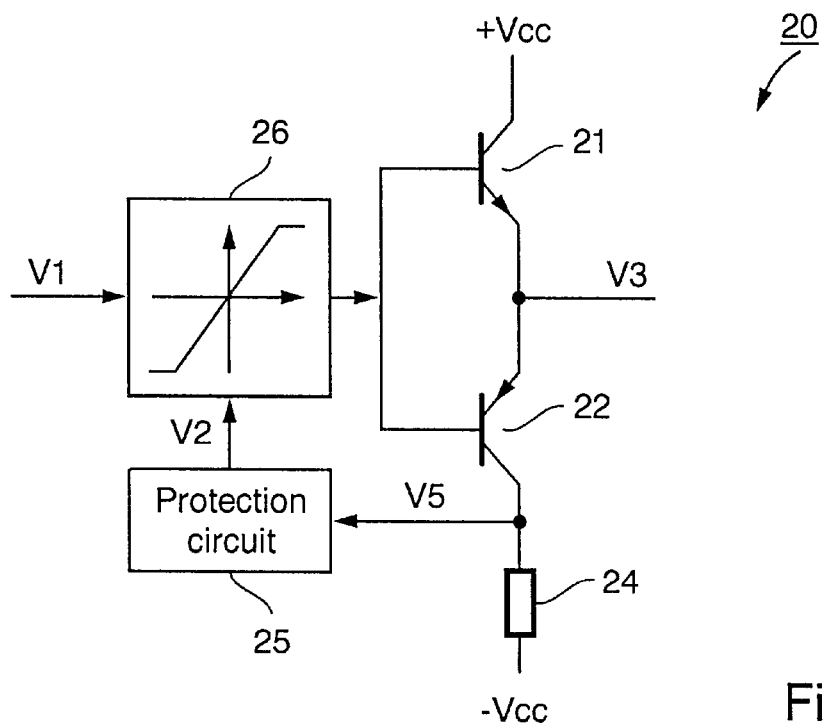
FIG. 2 illustrates a circuitry of a power amplifier circuit according to a first embodiment of the present invention.

FIG. 2 illustrates a circuitry of a power amplifier circuit 20 according to a first embodiment of the present invention. The collector of an npn-transistor 21 is connected to the $+V_{cc}$ terminal of a power supply, the emitter of the npn-transistor is connected to the emitter of a pnp-transistor 22, the collector of the pnp-transistor is connected to a first terminal of a resistor 24 and the second terminal of the resistor is connected to the $-V_{cc}$ terminal of the power supply. The bases of the two transistors are connected together and further to the output of a variable limiter circuit 26. An input terminal is connected to the input of the variable limiter circuit. The first terminal of the resistor is connected to an input terminal of a protection circuit 25. The output terminal of the protection circuit is connected to the control input of the variable limiter circuit. The emitters of the two transistors are connected to an output terminal.

Figure 3:
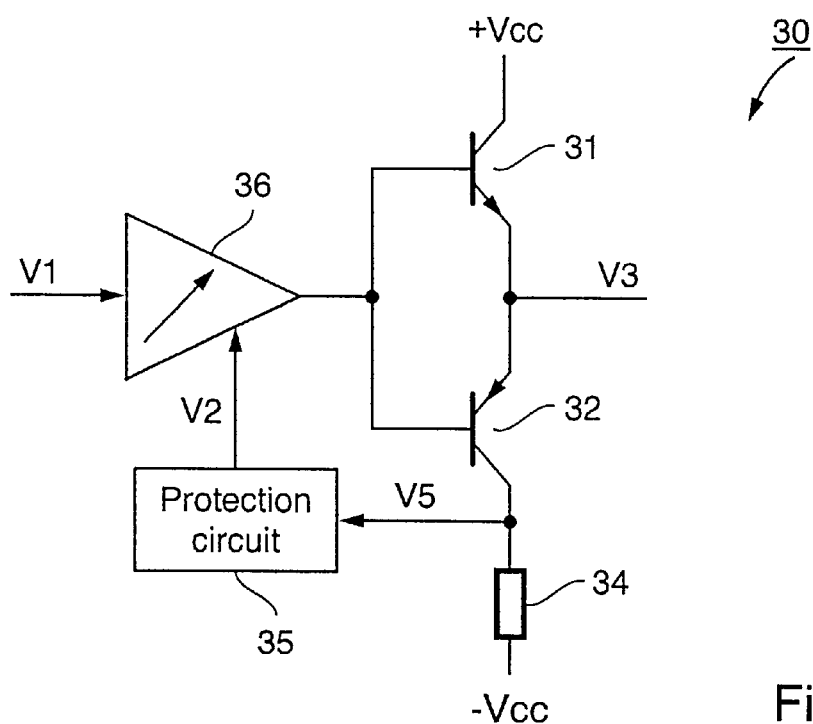
FIG. 3 illustrates a circuitry of a power amplifier circuit according to a second embodiment of the present invention.

FIG. 3 illustrates a circuitry of a power amplifier circuit 30 according to a second embodiment of the present invention. The collector of an npn-transistor 31 is connected to the $+V_{cc}$ terminal of a power supply, the emitter of the npn-transistor is connected to the emitter of a pnp-transistor 32, the collector of the pnp-transistor is connected to a first terminal of a resistor 34 and the second terminal of the resistor is connected to the $-V_{cc}$ terminal of the power supply. The bases of the two transistors are connected together and further to the output of a variable gain amplifier 36. An input terminal is connected to the input of the variable gain amplifier. The first terminal of the resistor is connected to an input terminal of a protection circuit 35. The output terminal of the protection circuit is connected to the control input of the variable gain amplifier. The emitters of the two transistors are connected to an output terminal.

Referring to both the first and the second embodiments the electrical potential at the input terminal is denoted V1, the electrical potential at the output terminal is denoted V3, the electrical potential at the first terminal of the resistor is denoted V5 and the electrical potential at the output terminal of the protection circuit is denoted V2.

Figure 9:
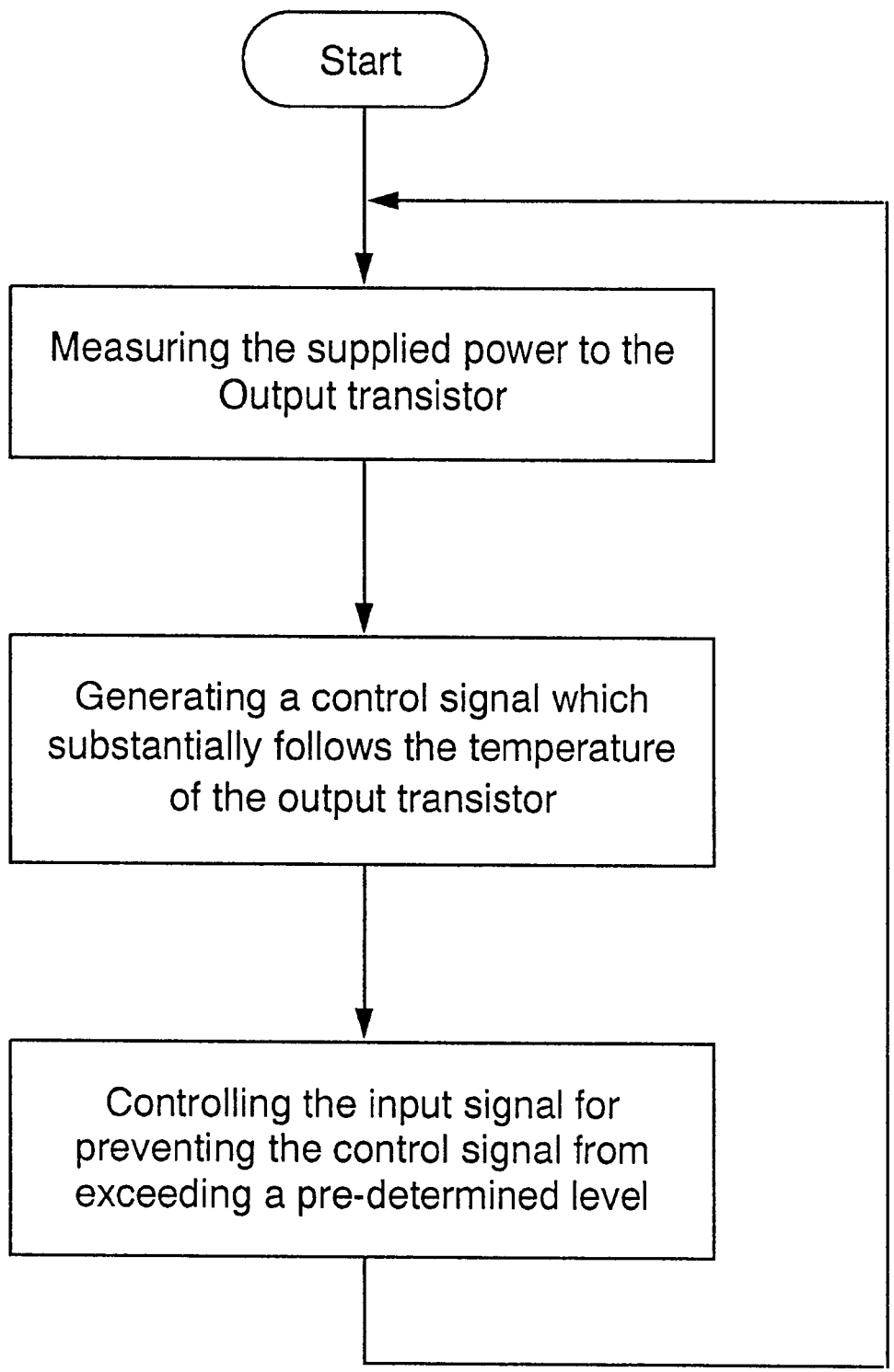
FIG. 9 illustrates a flow diagram of the operation of a power amplifier circuit according to the present invention.

The power amplifier circuits of the first and the second embodiments operate similarly. FIG. 9 illustrates a flow diagram of the operation of a power amplifier circuit according to the present invention. The first step is to measure the supplied power to at least one of the output transistors 22, 32. The electrical potential V5 will be the half-wave rectified equivalent to the current through the output transistors. Since the supplied voltage is constant the electrical potential V5 will be a measure of the current through the output transistor, and, hence, a measure of the supplied power to the output transistor. It should be noted that the value of the resistors are preferably chosen to have a small value. Assuming that the power supply voltages $+V_{cc}$ and $-V_{cc}$ are constant, the electrical potential V5 will be a good approximation of the momentary power loss in the output transistors. The second step is to generate a control signal which substantially follows the temperature of the output transistor. This is done by means of the protection circuit 25, 35 which makes use of the measured supplied power (see the first step). The protection circuit is further discussed below. The third step is to control the input signal to the power amplifier circuit for preventing the control signal from exceeding a pre-determined level. The control of the input signal can be implemented, for example, by limiting the input signal, as is shown in the first embodiment or by attenuating the input signal, as is shown in the second embodiment. Since the control signal substantially follows the temperature of the at least one output transistor the pre-determined level can be set to correspond to the maximum permissible temperature for the at least one transistor or, preferably, to a temperature slightly below the maximum permissible temperature to create a margin. The maximum permissible temperature for a transistor is also called the specified maximum temperature since this temperature is normally specified by the manufacturer of the transistor. The three steps are continuously repeated as is indicated in FIG. 9.

The output transistors can now be dimensioned to allow a full swing of the input signal for speech signals or signals with similar characteristics. The transistor protection circuit will only reduce the swing of the input signal when the average level is too high. This would be the case for example for a constant sine-wave at a high level.

Referring to the first and second embodiments, the main difference between the use of a variable limiter circuit and a variable gain amplifier for the reduction or attenuation of the input signal is that the limiter introduces more distortion to the output signal. The variable limiter circuit, however, requires less components to be implemented and thus occupies less space on a printed circuit board.

Figure 4:
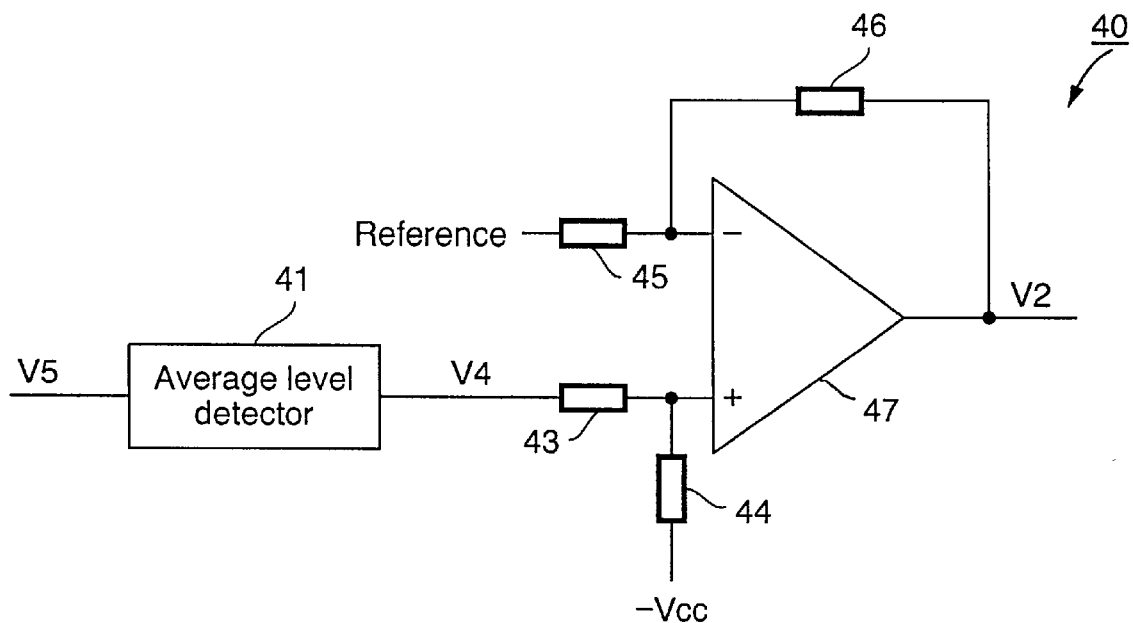
FIG. 4 illustrates a circuitry of a protection circuit according to the present invention.

FIG. 4 illustrates a circuitry of a protection circuit 40 according to the present invention. This protection circuit may be used as the protection circuits 25, 35 in the first and second embodiments. The input terminal of an average level detector 41 is connected to the input terminal of the protection circuit. The output terminal of the average level detector is connected to a first terminal of a first resistor 43. The second terminal of the first resistor is connected to the positive input of an op-amplifier 47, acting as a subtractor, and to a first terminal of a second resistor 44. The second terminal of the second resistor is connected to $-V_{cc}$. The negative input of the op-amplifier is connected to a first terminal of a third resistor 45 and to a first terminal of a fourth resistor 46. The second terminal of the third resistor is connected to a reference potential and the second terminal of the fourth resistor is connected to the output of the op-amplifier. The electrical potential at the input of the protection circuit is denoted V5, the electrical potential at the output of the average level detector is denoted V4 and the electrical potential at the output of the protection circuit is denoted V2.

At low signal levels at V5, approximately corresponding to a small momentary power loss in the output transistors, the output signal V2 of the protection circuit will be close to $-V_{cc}$ and neither the variable limiter circuit nor the variable gain amplifier will reduce or attenuate the input signal V1. If the momentary power loss in the output transistors increases the output signal V4 from the average level detector will increase. When the output signal from the average level detector exceeds the reference potential, constituting a threshold level, the output signal V2 with reference to $-V_{cc}$ of the amplifier will be equal to: $(A \cdot V4)-(B \cdot (\text{the reference potential}))$, where A and B are gain factors of the op-amplifier circuitry and · indicates multiplication. The gain factors are set by the values of the first, second, third and fourth resistors 43, 44, 45 and 46.

Figure 5:
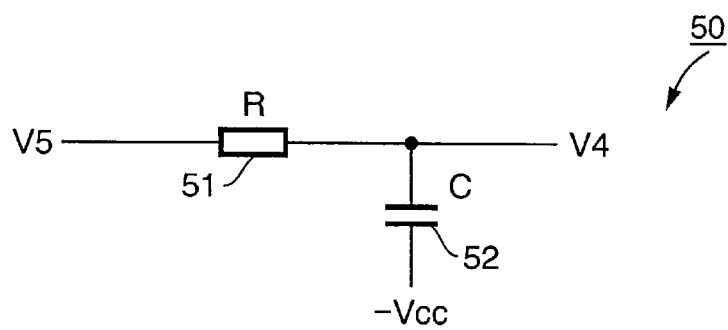
FIG. 5 illustrates a circuitry of an average level detector according to the present invention.

FIG. 5 illustrates a circuitry of an average level detector 50 according to the present invention. This average level detector may be used as the average level detector 41 discussed above in conjunction with FIG. 4. This average level detector 50 is an RC-network comprising a resistor 51 and a capacitor 52. The electrical potential at the input terminal of the detector is denoted V5 and the electrical potential at the output terminal is denoted V4. The values of the resistor and the capacitor are chosen such that the time-constant, RC, corresponds to the "thermal time-constant" in the output transistors. The "thermal time-constant" is discussed further below. When an appropriate time-constant has been chosen, the output signal V2 of the protection circuit 25, 35, 40, will follow the temperature of the output transistors, at least in a selected temperature range. Preferably, this temperature range includes the maximum temperature which has been specified for the output transistors. The output signal V2 from the protection circuit will be lagging behind the input signal level V1 just like the temperature is lagging behind the power loss in the output transistors.

Figure 6:
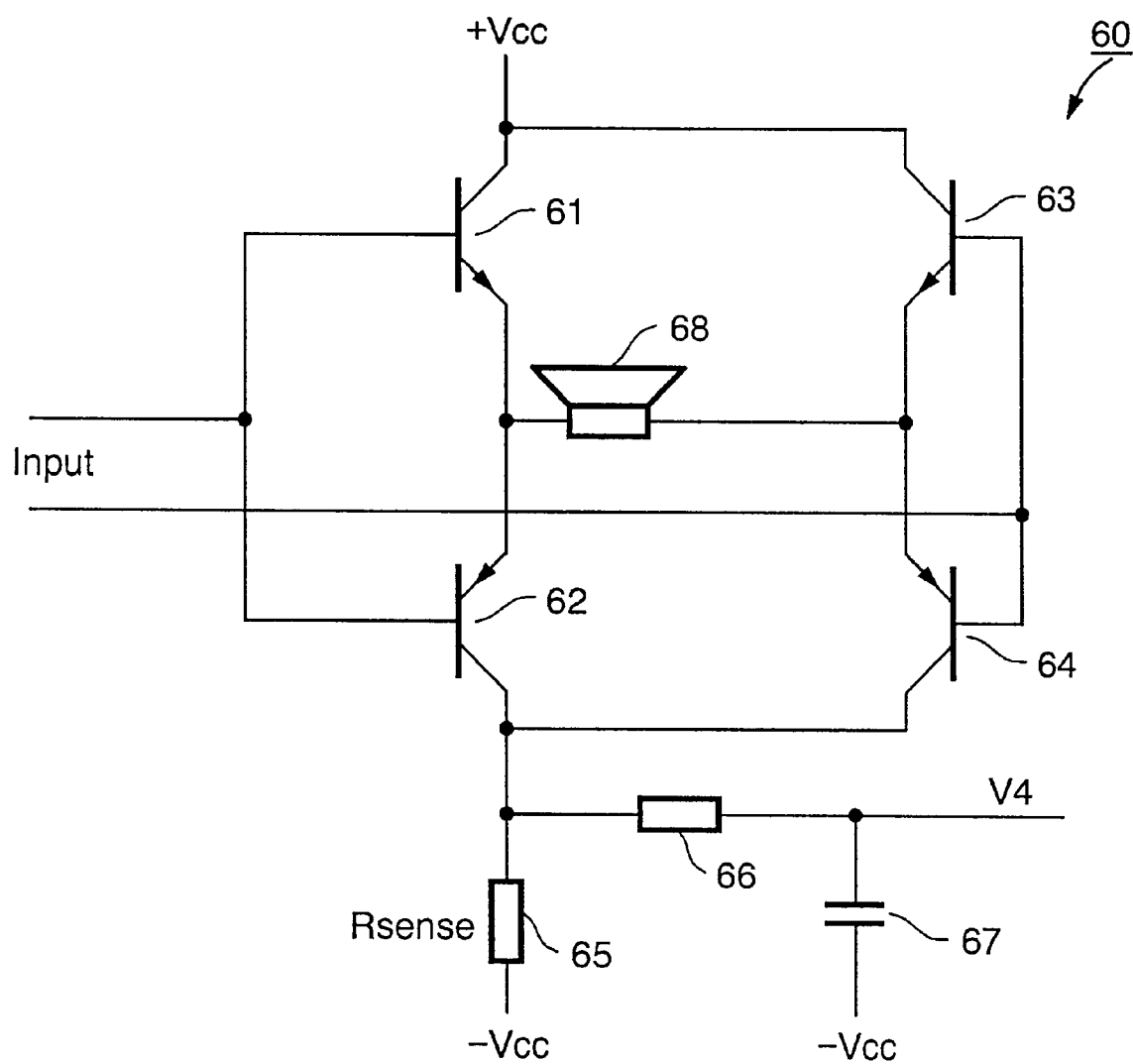
FIG. 6 illustrates a circuitry of a part of a power amplifier circuit according to a third embodiment of the present invention connected to a loudspeaker.

FIG. 6 illustrates a circuitry of a part of a power amplifier circuit 60 according to a third embodiment of the present invention connected to a loudspeaker 68. In this embodiment the loudspeaker is coupled in a bridge. The collector of a first npn-transistor 61 and a second npn-transistor 63 are connected to a voltage supply $+V_{cc}$. The emitter of the first npn-transistor is connected to the emitter of a first pnp-transistor 62 and to a first terminal of a loudspeaker 68. The emitter of the second npn-transistor is connected to the emitter of a second pnp-transistor 64 and to the second terminal of the loudspeaker. The collector of the first pnp-transistor is connected to the collector of the second pnp-transistor and to a first terminal of a first resistor 65 and to a first terminal of a second resistor 66. The second terminal of the first resistor is connected to $-V_{cc}$. The second terminal of the second resistor is connected to a first terminal of a capacitor 67. The second terminal of the capacitor is connected to $-V_{cc}$. The bases of the first npn-transistor and the first pnp-transistor are connected to a first input terminal. The bases of the second npn-transistor and the second pnp-transistor are connected to a second input terminal. The first resistor corresponds to the resistor 24 and 34 in the first and second embodiments, respectively. The resistor 66 and the capacitor 67 constitutes an RC-network which corresponds to the RC-network of the average level detector 50 discussed above. The electrical potential V4 at the first terminal of the capacitor 67 will be connected to an op-amplifier in a similar manner as described in conjunction with FIG. 4. The input signals at the first and second input terminals have equal amplitudes but have opposite phase. The first and second input terminals will be preceded by means for controlling the input signal. A variable limiter circuit or a variable gain amplifier, similar to those discussed in conjunction with the first and the second embodiments, respectively, may be used. However, the means for controlling the input signal needs to be able to control, for example by reduction or attenuation, both the signals on the first and the second input terminals. The signal V4 will in this case be a full-wave rectified and filtered value of the current through the loudspeaker driver transistors 61, 62, 63 and 64.

Figure 7:
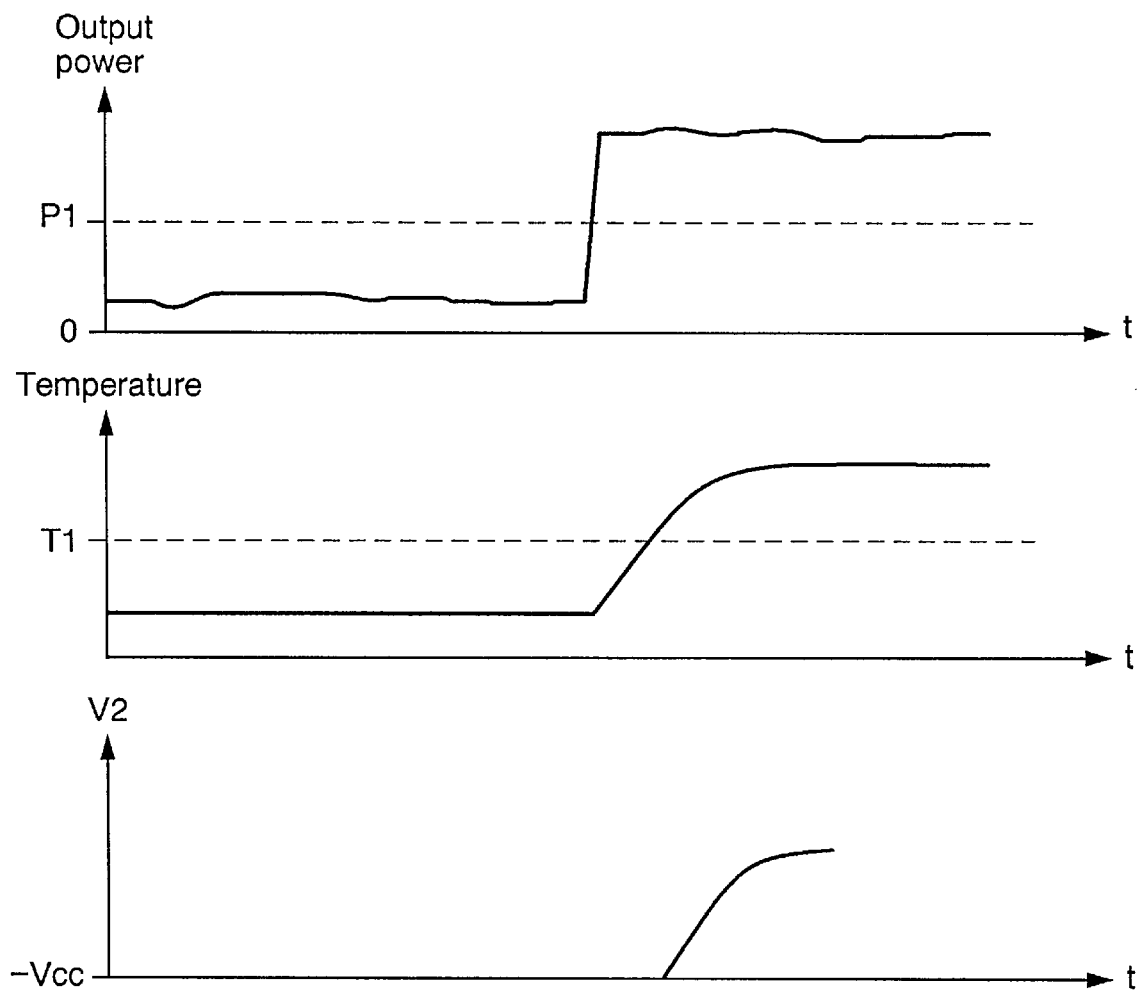
FIG. 7 illustrates in a time diagram the open loop behaviour of a protection circuit according to the present invention.
Figure 8:
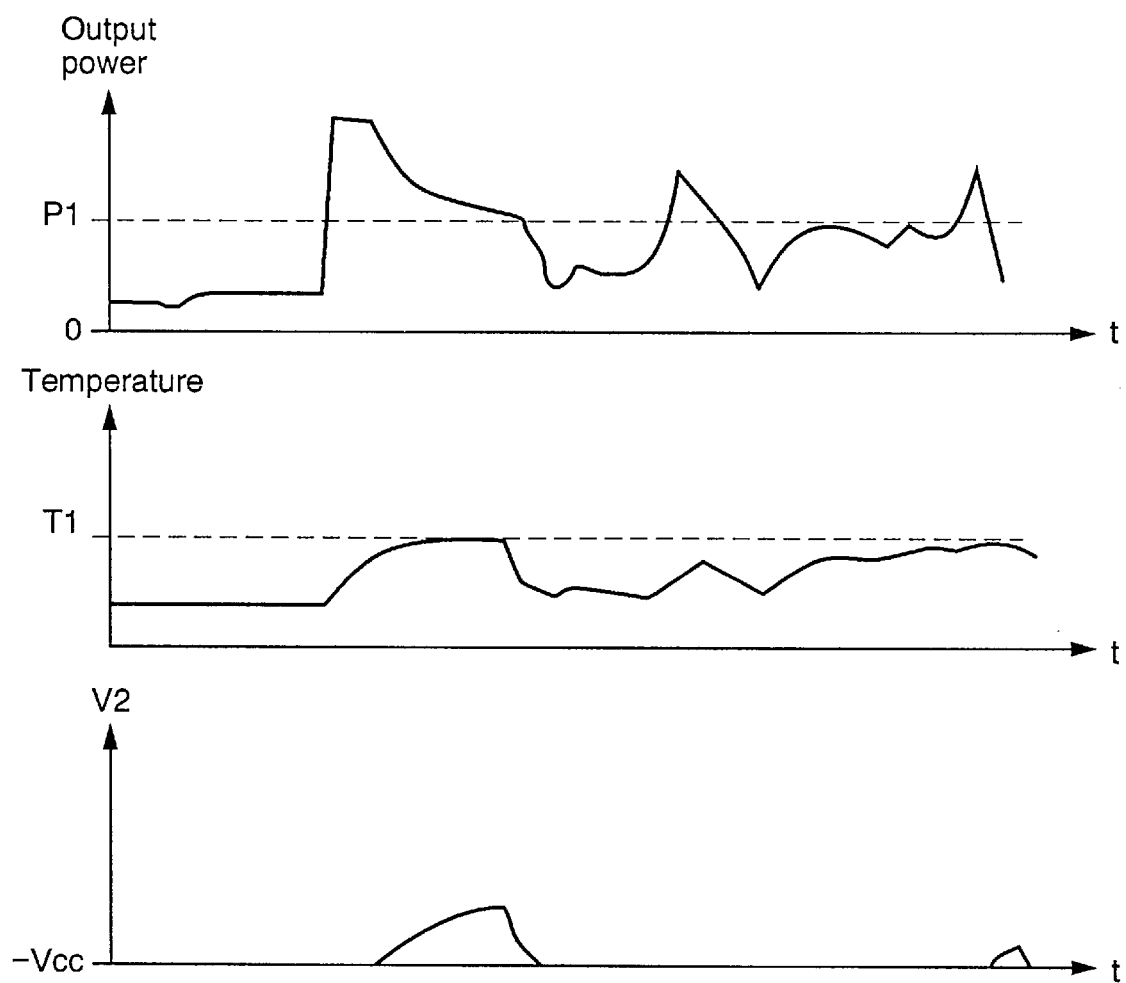
FIG. 8 illustrates in a time diagram the closed loop behaviour of a protection circuit according to the present invention.

The present invention will be further discussed in combination with FIG. 7 and FIG. 8 where FIG. 7 illustrates in a time diagram the open loop behaviour of a protection circuit according to the present invention. Open loop refers to the protection circuit 25, 35 being disconnected from the variable limiter circuit or the variable gain amplifier. The open loop behaviour is only presented to improve the understanding of the present invention. FIG. 8 illustrates in a time diagram the normal closed loop behaviour of a protection circuit according to the present invention, i.e. when the electrical potential V2 controls the reduction or limitation of the input signal. The output power as a function of time, the temperature of the output transistors as a function of time and the electrical potential V2 as a function of time are shown in the three diagrams of FIG. 7 and FIG. 8. Pl is the maximum permissible continuous output power and Tl is the maximum permissible junction temperature of the output transistors.

In the case the output power of the power amplifier is well below its rating the output transistors will also stay at a temperature well below their limit. When the signal level is increased momentarily the power loss will also be increased at the same time but the temperature in the output transistors will increase slowly and after an infinite period of time the temperature will stabilize at a junction temperature determined by the thermal resistance and the ambient temperature. This behaviour is shown in FIG. 7.

Mathematically the temperature response for an output power step is given in Equation 4 (· indicates multiplication):

$$T(t)=P \cdot R_{th}+T_a-(P \cdot R_{th}+T_a-T_o)e^{-t/(m \cdot h \cdot R_{th})} \quad \text{Eq. 4}$$

Where P is the power loss after the step (W), $R_{th}$ is the thermal resistance of a specific transistor and a specific heat-sink (K/W), $T_a$ is the ambient temperature which will be considered to be constant (K), $T_o$ is the initial temperature (K), m is the mass of the specific transistor and the specific heat-sink (kg) and h is the heat capacity (J/(K·kg)).

Equation 4 originates from a first order differential equation given in Equation 5 (· indicates multiplication).

$$T(t) = T_o + \int_0^t \left( \frac{P}{m \cdot h} - \frac{T(t_1) - T_a}{m \cdot h \cdot R_{th}} \right) dt_1 \quad \text{Eq. 5}$$

If $T_a$ is set equal to $T_o$, the formula will be similar to the formula for the electrical potential of a capacitor which is charged by a constant voltage through a resistor. If the time-constant (RC) of the average level detector is set to be equal to the "thermal time-constant" ($m \cdot h \cdot R_{th}$) and the transfer function from the transistor current to the electrical potential V4 is chosen appropriately, then when the output power becomes equal to the maximum permissible continuous output power, Pl, the electrical potential V4 will become equal to the reference voltage as shown in FIG. 4.

As is shown in FIG. 8, when the electrical potential V2 controls the reduction or limitation of the input signal, the output power will peak for a short period of time when the output power experiences a step which exceeds the maximum permissible continuous output power level. The output power will then slowly approach the level of the maximum permissible continuous output power, Pl. At the same time the junction temperature of the output transistors will slowly approach the maximum permissible junction temperature.

Referring to FIG. 8 the first peak of the output power is not affected at first, but as V2 increases the output power is reduced, and by that the temperature of the output transistors will slowly approach their limit. When the output power is low the temperature also stays low. The second output power peak is too short to make V2 to increase above a potential close to $-V_{cc}$ and the temperature stays below the limit as well. Before the third peak the output power has for some time been close to the permissible continuous level and so has the temperature in the output transistors. At this stage, even the third short peak makes V2 rise above $-V_{cc}$ and reduces the output power.

It should be understood that the feedback loop consisting of the protection circuit may be implemented using digital technology. In this case the electrical potential V5 is converted to a digital value by means of an analogue-to-digital converter. The temperature of the output transistors is then calculated by means of digital calculation means.

Furthermore, the variable limiter circuit 26 and the variable gain amplifier 36 of the first and second embodiment of the present invention can also be implemented in digital technology by means of a Digital Signal Processor, DSP.

Furthermore, it should be understood that a number of known control systems may be used to control the means for controlling the input signal having the generated control signal, which substantially follows the temperature of the transistor, and the pre-determined threshold level as inputs.

An advantage of the power amplifier circuits according to the present invention is that the output power capability of the output transistors are utilised efficiently. A further advantage of the power amplifier circuits according to the present invention is that they are not expensive to implement and that they can be implemented with small physical dimensions. A further advantage of the power amplifier circuits according to the present invention is that they require only one fixed potential from the power supply. An advantage of the method of controlling the temperature of a transistor in a power amplifier according to the present invention is that the output power capability of the output transistor is utilised efficiently.

I claim:

1. A power amplifier circuit comprising:

an input terminal for receiving an input signal and an output terminal for providing an output signal;

at least one transistor for amplifying the input signal to provide the output signal;

means for controlling the input signal received at the input terminal; and means for generating a control signal which substantially follows the temperature of the at least one transistor at least in a selected temperature range, said means for generating a control signal comprises means for generating a signal that substantially corresponds to a momentary power loss in said at least one transistor;

wherein said means for controlling the input signal prevents the control signal from exceeding a pre-determined level, said level corresponding to a pre-determined temperature of the at least one transistor which is equal to or below a specified maximum temperature for the at least one transistor.

2. The power amplifier circuit of claim 1 wherein the selected temperature range includes the specified maximum temperature for the at least one transistor.

3. The power amplifier circuit of claim 1 wherein the means for generating a control signal includes means for measuring the supplied power to the at least one transistor.

4. The power amplifier circuit of claim 3 wherein the means for measuring the supplied power comprises a resistor connected such that the current through the resistor multiplied with the voltage over the resistor corresponds to the supplied power to the at least one transistor.

5. The power amplifier circuit of claim 1 wherein the means for generating a control signal includes an average level detector comprising an RC-network.

6. The power amplifier circuit of claim 1 wherein the means for generating a control signal includes a Digital Signal Processor, DSP.

7. The power amplifier circuit of claim 1 wherein the means for controlling the input signal controls the input signal by attenuating or limiting the signal.

8. The power amplifier circuit of claim 1 wherein the means for controlling the input signal comprises an amplifier having an adjustable gain which is controlled by the control signal.

9. The power amplifier circuit of claim 1 wherein the means for controlling the input signal comprises a limiter having a variable threshold level for its limitation which is controlled by said control signal.

10. The power amplifier circuit of claim 1, wherein the means for generating a control signal includes means for simulating a thermal time-constant of said at least one transistor.

11. The power amplifier circuit of claim 5, wherein a time-constant of the RC-network corresponds to a thermal time-constant of said at least one transistor.

12. The power amplifier circuit of claim 10, wherein the thermal time-constant of the at least one transistor is dependent on a mass of the at least one transistor, a heat capacity of the at least one transistor, and a thermal resistance of the at least one transistor.

13. The power amplifier circuit of claim 11, wherein the thermal time-constant of the at least one transistor is dependent on a mass of the at least one transistor, a heat capacity of the at least one transistor, and a thermal resistance of the at least one transistor.

14. A method of controlling a temperature of a transistor in a power amplifier circuit having an input terminal for receiving an input signal and an output terminal for providing an output signal comprising the steps of:
measuring a signal which substantially corresponds to a momentary power loss in the transistor;
generating a control signal which substantially follows the temperature of the transistor, in at least a selected temperature range, by using said measured signal; and
controlling the input signal for preventing the control signal from exceeding a predetermined level, said level corresponding to a temperature of the transistor which is equal to or below a specified maximum temperature for the transistor.

15. The method of claim 14, wherein the selected temperature range includes the specified maximum temperature for the transistor.

16. The method of claim 14, wherein the step of generating a control signal includes the step of detecting the average level of said measured signal.

17. The method of claim 14, wherein the step of controlling the input signal includes the step of attenuating or limiting the input signal.

18. The method of claim 14, wherein the step of controlling the input signal includes the step of adjusting the gain of an amplifier to which the input signal is connected.

19. The method of claim 14, wherein the step of controlling the input signal includes the step of setting the threshold level of a variable limiter circuit to which the input signal is connected.

20. The method of claim 14, wherein the step of generating a control signal includes the step of forming an integral of the measured signal, the integral incorporating a time-constant that substantially corresponds to a thermal time-constant of the transistor.

* * * * *